WAFER AND ELECTRONIC COMPONENT FUSED THERETO

Original Filed Sept. 24, 1957

INVENTORS
Charles C. Rayburn, &
Forrest T. Mullikin.
BY Robert D. Silver
ATTY

United States Patent Office 3,124,721
Patented Mar. 10, 1964

3,124,721
WAFER AND ELECTRONIC COMPONENT FUSED THERETO

Charles C. Rayburn, Falls Church, and Forrest T. Mullikin, Springfield, Va., assignors, by mesne assignments, to Illinois Tool Works, Inc., a corporation of Delaware
Original application Sept. 24, 1957, Ser. No. 685,890, now Patent No. 3,034,198, dated May 15, 1962. Divided and this application Feb. 19, 1962, Ser. No. 174,115
5 Claims. (Cl. 317—101)

This invention relates to electronic assemblies and more particularly to modular electronic assemblies of the type shown and described in Patent No. 2,774,014 to R. L. Henry Jr. This application is a division of application Serial Number 685,890 filed September 24, 1957, now Patent Number 3,034,198.

In the manufacture of modular electronic assemblies, standardized electronic components are mounted on ceramic wafers adapted to be secured in spaced parallel relationship along riser wires, the wafers having printed conductors thereon leading from their respective components to their related riser wires.

By employing new methods and apparatus for making and assembling the various parts, it is possible to reduce the cost of modular electronic assemblies. It is, therefore, a general object of the invention to provide new methods adapted to facilitate assembling operations and to thereby reduce the cost of manufacture of modular electronic assemblies and simultaneously thereby provide an improved assembly.

Another object of this invention is to provide a modular electronic assembly wherein a ceramic wafer having printed conductors thereon in spaced relation has a capacitor construction having insulated portions and conductor portions fusingly mounted respectively to the wafer and the spaced conducting portions so that the adherence and mounting of the capacitor to the wafer is not dependent upon the relatively mechanically weak electrical connection of the electrode portions of the capacitor to the spaced printed conductors on the wafer, whereby a modular electronic assembly is provided which is exceptionally rigid and which will withstand extreme vibrational forces and accelerations in addition to higher ambient temperatures.

Another object of the invention resides in the provision of a wound capacitor comprising aluminum foil electrodes having spiral edge portions coated with copper prior to forming the electrical connections between the electrodes and the printed conductors on the ceramic wafer, the electrode foils being separated by a thermoplastic dielectric, such as polyethylene terephthalate, which also forms the outer cover for the capacitor.

Another object of the invention resides in the provision of a capacitor wafer construction wherein the capacitor is securely positioned on a wafer by the application of heat to the wafer to cause the dielectric material on the capacitor to adhere to the wafer to provide a strong compact assembly.

The invention embodies other novel features, details of construction and arrangement of parts which are hereinafter set forth in the specification and claims and illustrated in the accompanying drawing, wherein:

Figure 1:
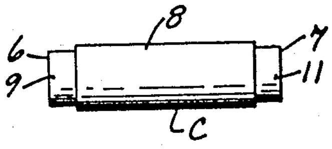
FIG. 1 is a side elevation illustrating a conventional wound capacitor.

Referring now to the drawings for a better understanding of the invention, FIG. 1 illustrates a conventional wound capacitor comprising tin foil electrodes 6 and 7 convolutely wound with and separated by dielectric tapes 8, the inner side edge portions of the electrode foils being in overlapping relationship, and the outer side edge portions of the electrode foils extending outwardly beyond the side edges of the dielectric tapes, as indicated at 9 and 11.

In the winding of the capacitor, it is contemplated that the dielectric tapes will be wound for several turns following the termination of the foils, and that the outer end of the outer dielectric tape will then be heat-sealed to its underlying convolution by a heated iron.

The tapes 8 are formed of polyethylene terephthalate and made in accordance with Patent No. 2,465,319 issued to John Rex Whinfield et al., the tape now being sold under the trademark "Mylar," by E. I. du Pont de Nemours and Company.

Figure 2:
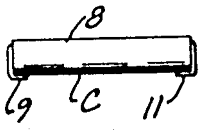
FIG. 2 is a side elevation showing the capacitor of FIG. 1 in flattened form, and also showing the projecting side edge portions of the electrode foils folded back toward each other and along one flattened side of the capacitor.
Figure 3:
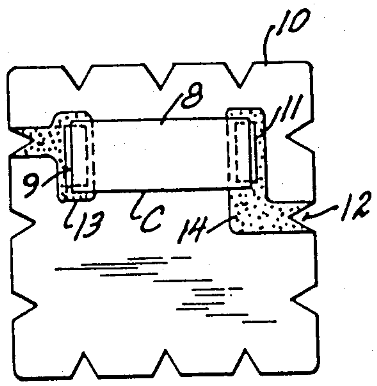
FIG. 3 is a plan view showing the capacitor assembled on a ceramic wafer.
Figure 4:
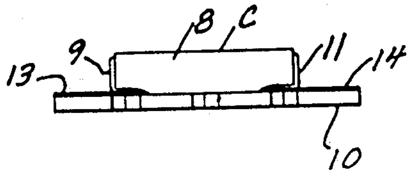
FIG. 4 is a side elevation of same.

After the capacitor has been wound in the manner shown and described, it is flattened by the application of pressure against opposite sides thereof. The edge portions 9 and 11 of the electrode foils are then folded back against one of the flattened sides of the capacitor, as illustrated in FIG. 2; after which, it is mounted on a wafer 10 formed of steatite.

The ceramic wafer 10 is formed with notches 12 along its side edges to receive riser wires (not shown), the walls defining the notches being coated with an electric conductive material which is applied in the form of a paint and preferably contains silver and a ceramic flux, such as glass. The same electric conductive material is also applied to one or both faces of the wafer to form conductors 13 and 14 for connecting the electrode foils to their respective riser wires. After applying the paint, the wafer is fired at a sufficiently high temperature to cause great adherence of the silver thereto, as the glass acts to join the silver to the steatite.

During assembly of the capacitor on the wafer, the wafer is first heated to a temperature of approximately from 600° F. to 800° F. by means of a flame. The capacitor is then mounted on the heated wafer with the edge portions of the electrode foils engaging their respective printed conductors 13 and 14, thereby fusing the edge portions to their conductors and also fusing the dielectric tape to the steatite. Upon cooling of the assembly, the capacitor is rigidly bonded to the wafer and a good electrical connection is provided between the end portions 9 and 11 and their respective printed conductors.

Figure 5:
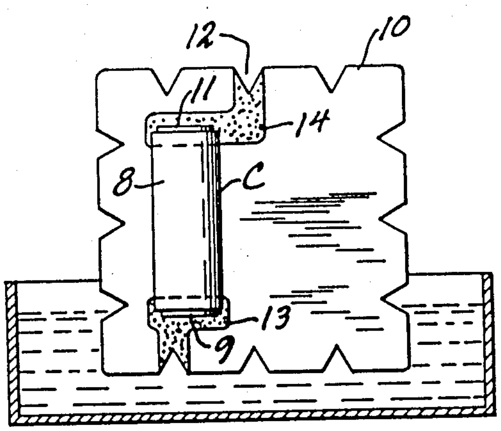
FIG. 5 illustrates a modified form of the invention.

As a modified form of the invention, the ceramic wafer 10 may be heated over a flame to a temperature of approximately 700° F. A capacitor of conventional form, as shown in FIG. 1, is then engaged against the heated wafer to fuse the dielectric tape 8 to the steatite, the tape being of the type heretofore described. The assembly is then dipped into a bath of molten solder, as illustrated in FIG. 5, to apply solder to the walls of the notches 12 and at the same time, form solder connections between the outer ends of the electrode foils 9 and 11 and their respective printed conductors 13 and 14.

In the modified form of the invention thus described, it is contemplated that the electrode foils 6 and 7 may be formed of either tin or aluminum. However, if made of aluminum, the projecting spiral edge portions 9 and 11 of the electrode foils 6 and 7 are coated with copper prior to being dipped into the bath of molten solder.

While the invention has been shown and described in several forms, it is obvious to those skilled in the art that it is not so limited, but is susceptible of various changes and modifications without departing from the spirit of the invention or the scope of the appended claims.

The invention is claimed as follows:

1. In a modular electronic assembly, a ceramic wafer having metallic printed conductors thereon, a capacitor comprising electrode foils in fused engagement with said conductors, said capacitor having a polyethylene terephthalate cover in fused engagement with said wafer.

2. In a modular electronic assembly, a ceramic wafer, and an electronic component having a polyethylene terephthalate cover in fused engagement with said wafer.

3. In a modular electronic assembly, a ceramic wafer having printed conductors thereon, a capacitor comprising electrode foils convolutely wound with and separated by dielectric tapes of polyethylene terephthalate providing a cover for the capacitor, said cover having a fused connection to said wafer, said electrode foils having connections to their respective conductors.

4. An assembly according to claim 3 wherein, said electrode foils have fused connections to their respective conductors.

5. An assembl, according to claim 3 wherein, said electrode foils are formed of aluminum and have end portions coated with copper, said end portions having soldered connections to their respective conductors.

References Cited in the file of this patent

UNITED STATES PATENTS

| | | |
|---|---|---|
| 2,774,014 | Henry | Dec. 11, 1956 |
| 2,978,612 | Lutton | Apr. 4, 1961 |